United States Patent [19]
Dennison et al.

[11] Patent Number: 5,888,877
[45] Date of Patent: Mar. 30, 1999

[54] METHOD OF FORMING RECESSED CONTAINER CELLS

[75] Inventors: Charles H. Dennison, Meridian; Bradley J. Howard; Mark E. Jost, both of Boise, all of Id.

[73] Assignee: Micron Technology, Inc., Boise, Id.

[21] Appl. No.: 959,606

[22] Filed: Oct. 28, 1997

[51] Int. Cl.[6] .................................................. H01L 21/20
[52] U.S. Cl. .............................................. 438/386; 438/243
[58] Field of Search ...................................... 438/243, 244, 438/245, 386, 387, 388, 398

[56] References Cited

U.S. PATENT DOCUMENTS 4,847,214 7/1989 Robb et al. .............................. 438/386
5,422,294 6/1995 Noble, Jr. ................................ 438/246

*Primary Examiner*—Tuan H. Nguyen
*Attorney, Agent, or Firm*—Fletcher, Yoder & Van Someren

[57] ABSTRACT

A container capacitor having a recessed conductive layer. The recessed conductive layer is typically made of polysilicon. The recessed structure reduces the chances of polysilicon "floaters," which are traces of polysilicon that remain on the surface of the substrate, coupling adjacent capacitors together to create short circuits. The disclosed method of creating such a recessed structure uses chemical mechanical planarization to remove the layer of polysilicon and an overlying layer of photoresist from the upper surface of the substrate in which a container is formed. A dry etch selectively isolates a rim of the polysilicon within the container to recess the rim, while the remainder of the polysilicon in the container is protected by the layer of photoresist.

40 Claims, 3 Drawing Sheets

METHOD OF FORMING RECESSED CONTAINER CELLS

BACKGROUND OF THE INVENTION

1. Field of the Invention

The present invention relates generally to semiconductor processing and, more particularly, to a recessed structure and a method of forming the same.

2. Description of the Related Art

Microprocessor-controlled integrated circuits are used in a wide variety of applications. Such applications include personal computers, vehicle control systems, telephone networks, and a host of consumer products. As is well known, microprocessors are essentially generic devices that perform specific functions under the control of a software program. This software program is typically stored in a memory device coupled to the microprocessor. Not only does the microprocessor access the memory device to retrieve the program instructions, it also typically stores and retrieves data created during execution of the program in the memory device.

There are a wide variety of different memory devices available for use in microprocessor-based systems. The type of memory device chosen for a specific function within a microprocessor-based system depends largely upon what features of the memory are best suited to perform the particularly function. Most microprocessor-based systems include a dynamic random access memory (DRAM). DRAMs are volatile memories that must be continually powered in order to retain the contents. However, DRAMs are quite advantageous in that they tend to provide greater storage capability and programming cycles than non-volatile memories, such as read only memories.

A typical DRAM includes a memory array in which memory cells are arranged in rows and columns. Conductive lines, called word lines, connect the memory cells in a given row together, while perpendicular conductive lines, called digit lines, connect memory cells in a given column together. Each DRAM memory cell typically includes an access device, such as a transistor, and a storage device, such as a capacitor. Information is stored in each DRAM memory cell as the presence or absence of a charge on the storage capacitor. In response to the appropriate voltages on a selected word line and digit line, the access transistor couples the storage capacitor to the digit line so that a sense amplifier can determine whether the storage capacitor contains a charge, commonly called a logical one, or no charge, commonly called a logical zero.

To fabricate as many memory cells as possible on a single chip, the size of each memory cell should be minimized. However, the minimization of the size of a storage capacitor in a DRAM memory cell is typically limited by the amount of charge that the storage capacitor is able to retain. In fact, one of the primary concerns in DRAM fabrication is the desire to pack memory cells densely while maintaining the required capacitance levels of the storage capacitors. Simply put, it is essential that the plates of the storage capacitors be large enough to retain a charge adequate to allow the sense amplifiers to determine whether the storage capacitor is storing a logical one or a logical zero.

For years after the initial development of the basic DRAM memory cell, the storage capacitors were formed as two dimensional, or planar, capacitors. In other words, the storage capacitors were formed by two flat layers of conductive material, such as polysilicon or metal, separated by a flat dielectric layer. As the density of the memory cells increased and the size of the memory cells decreased, the size of the planar plates of the storage capacitors was clearly a limiting factor hindering further size reductions.

To reduce the size of DRAM memory cells further, and to provide storage capacitors with adequate capacitance, three dimensional capacitors were developed. One common three dimensional capacitor is referred to as a container capacitor. A container capacitor is fabricated by forming a container in a dielectric or insulative substrate. A conductive material, such as polysilicon, is deposited onto the substrate so that it lines the surface of the container. Similarly, a dielectric layer is deposited over the substrate so that it lines the polysilicon layer within the container. Finally, a second layer of conductive material, such as polysilicon, is deposited over the substrate so that it lines the dielectric layer within the container. Clearly, a container capacitor's plates have a substantially greater area than a planar capacitor that occupies the same amount of die area.

Although container capacitors improved upon planar capacitors, they are not without their problems. During the fabrication of the first polysilicon layer of a container capacitor, it is not uncommon that residual polysilicon may remain on the substrate around the edge of the container. These polysilicon residues, sometimes called floaters, are conductive and, thus, can cause short circuits, typically between adjacent container capacitors in the memory array.

The present invention is directed to one or more of the problems set forth above.

SUMMARY OF THE INVENTION

In accordance with one aspect of the present invention, there is provided a method of forming a recessed microelectronic structure. The method includes the steps of: (a) forming a container in a substrate, the substrate having an upper surface; (b) disposing a layer of conductive material within the container and over the upper surface of the substrate; (c) disposing a layer of dissimilar material over the layer of conductive material; (d) removing the layer of dissimilar material and the layer of conductive material from at least a portion of the upper surface of the substrate; and (e) dry etching a portion of the layer of conductive material remaining in the container to recess the layer of conductive material below the upper surface of the container.

In accordance with another aspect of the present invention, there is provided a method of forming a recessed microelectronic structure. The method includes the steps of: (a) forming a container in a substrate, the substrate having an upper surface; (b) disposing a layer of conductive material within the container and over the upper surface of the substrate; (c) disposing a layer of dissimilar material over the layer of conductive material; (d) removing the layer of dissimilar material and the layer of conductive material from the upper surface of the substrate by chemical mechanical planarization; and (e) recessing a portion of the layer of conductive material remaining in the container below the upper surface of the container.

In accordance with still another aspect of the present invention, there is provided a method of forming a recessed microelectronic structure. The method includes the steps of: (a) forming a container in a dielectric material, the dielectric material having an upper surface; (b) disposing a layer of conductive material within the container and over the upper surface of the dielectric material; (c) disposing a layer of photoresist over the layer of conductive material; (d) removing the layer of photoresist and the layer of conductive material from the upper surface of the dielectric material using chemical mechanical planarization; and (e) dry etching a portion of the layer of conductive material remaining in the container to recess the layer of conductive material below the upper surface of the container.

In accordance with yet another aspect of the present invention, there is provided a method of forming a recessed microelectronic structure. The method includes the steps of: (a) forming a container in a dielectric material, the dielectric material having an upper surface; (b) disposing a layer of polysilicon within the container and over the upper surface of the dielectric material; (c) disposing a layer of photoresist over the layer of polysilicon; (d) removing the layer of photoresist and the layer of polysilicon from the upper surface of the dielectric material using chemical mechanical planarization; and (e) dry etching a portion of the layer of polysilicon remaining in the container to recess the layer of polysilicon below the upper surface of the container.

In accordance with a further aspect of the present invention, there is provided a method of forming a capacitor in a microelectronic circuit. The method includes the steps of: (a) forming a container in a substrate, the substrate having an upper surface; (b) disposing a first layer of conductive material within the container and over the upper surface of the substrate; (c) disposing a layer of photoresist over the first layer of conductive material; (d) removing the layer of photoresist and the first layer of conductive material from the upper surface of the substrate using chemical mechanical planarization; (e) recessing the first layer of conductive material remaining in the container below the upper surface of the container; (f) removing the layer of photoresist remaining in the container; (g) disposing a layer of dielectric material over the recessed first layer of conductive material and over the upper surface of the substrate; (h) disposing a second layer of conductive material over the layer of dielectric material; and (i) removing the layer of dielectric material and the second layer of conductive material from the upper surface of the substrate.

In accordance with an even further aspect of the present invention, the is provided a method of forming a capacitor in a microelectronic circuit. The method includes the steps of: (a) forming a container in a substrate, the substrate having an upper surface; (b) disposing a first layer of conductive material within the container and over the upper surface of the substrate; (c) disposing a layer of photoresist over the first layer of conductive material; (d) removing at least a portion of the layer of photoresist and at least a portion of the first layer of conductive material from the upper surface of the substrate to expose at least a portion of the upper surface of the substrate adjacent the container; (e) dry etching a portion of the first layer of conductive material remaining in the container to recess the first layer of conductive material below the upper surface of the container; (f) removing the layer of photoresist remaining in the container; (g) disposing a layer of dielectric material over the recessed first layer of conductive material and over the upper surface of the substrate; (h) disposing a second layer of conductive material over the layer of dielectric material; and (i) removing the layer of dielectric material and the second layer of conductive material from the upper surface of the substrate.

In accordance with a still further aspect of the present invention, there is provided a method of forming a capacitor in a microelectronic circuit. The method includes the steps of: (a) forming a container in a first layer of dielectric material, the first layer of dielectric material having an upper surface; (b) disposing a first layer of polysilicon within the container and over the upper surface of the first layer of dielectric material; (c) disposing a layer of photoresist over the first layer of polysilicon; (d) removing the layer of photoresist and the first layer of polysilicon from the upper surface of the first layer of dielectric material using chemical mechanical planarization; (e) dry etching a portion of the first layer of polysilicon remaining in the container to recess the first layer of polysilicon below the upper surface of the first layer of dielectric material; (f) removing the layer of photoresist remaining in the container; (g) disposing a second layer of dielectric material over the recessed first layer of polysilicon and over the upper surface of the first layer of dielectric material; and (h) disposing a second layer of polysilicon over the second layer of dielectric material.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Specific embodiments of memory elements and methods of making such memory elements are described below as they might be implemented for use in semiconductor memory circuits. In the interest of clarity, not all features of an actual implementation are described in the specification. It should be appreciated that in the development of any such actual implementation (as in any semiconductor engineering project), numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of semiconductor design and fabrication for those of ordinary skill having the benefit of this disclosure. Furthermore, the fabrication of a single device is described with the understanding that many similar devices may be fabricated simultaneously.

Figure 1:
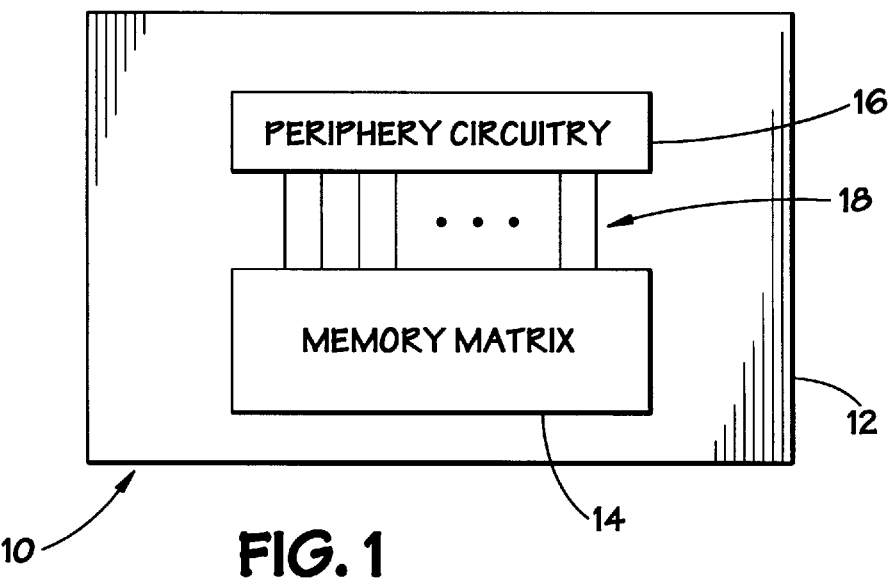
FIG. 1 illustrates a semiconductor memory.

Turning now to the drawings, and referring initially to FIG. 1, a memory device is illustrated and generally designated by a reference numeral 10. The memory device 10 is an integrated circuit memory that is advantageously formed on a semiconductor substrate 12. The memory device 10 includes a memory matrix or array 14 that includes a plurality of memory cells for storing data, as described below. The memory matrix 14 is coupled to periphery circuitry 16 by the plurality of control lines 18. The periphery circuitry 16 may include circuitry for addressing the memory cells contained within the memory matrix 14, along with circuitry for storing data in and retrieving data from the memory cells. The periphery circuitry 16 may also include other circuitry used for controlling or otherwise ensuring the proper functioning of the memory device 10.

Figure 2:
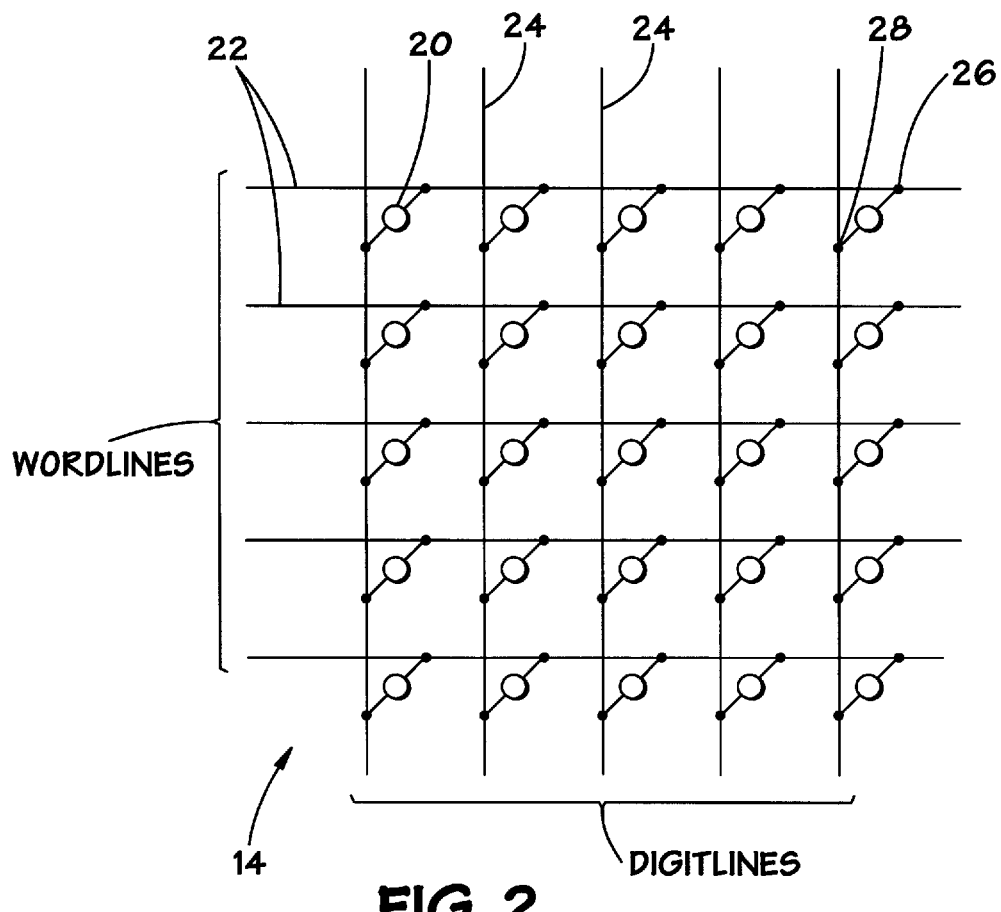
FIG. 2 illustrates a portion of a memory array of FIG. 1.

A more detailed description of the memory matrix 14 is illustrated in FIG. 2. As can be, seen, the memory matrix 14 includes a plurality of memory cells 20 that are arranged in generally perpendicular rows and columns. The memory cells 20 in each row are coupled together by a respective word line 22, and the memory cells 20 in each column are coupled together by a respective digit line 24. Specifically, each memory cell 20 includes a word line node 26 that is coupled to a respective word line 22, and each memory cell 20 includes a digit line node 28 that is coupled to a respective digit line 24. The conductive word lines 22 and digit lines 24 are collectively referred to as address lines. These address lines may be electrically coupled to the periphery circuitry 16 so that each of the memory cells 20 can be accessed for storage and retrieval of information.

Figure 3:
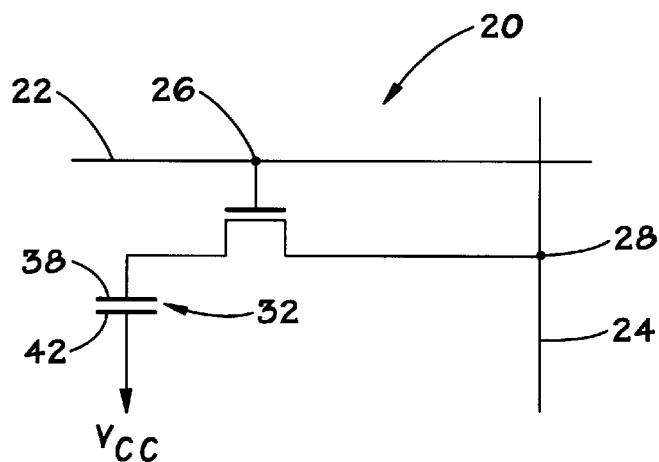
FIG. 3 illustrates an electric schematic diagram of an exemplary memory cell in the array of FIG. 2.

FIG. 3 illustrates an exemplary memory cell 20 that may be used in the memory matrix 14. The memory cell 20 includes a memory element 32 that is coupled to an access device 30. In this embodiment, the memory element 32 is illustrated as a storage capacitor, and the access device 30 is illustrated as a MOSFET transistor. The base of the transistor 30 is coupled to the word line 22 to form the word line node 26, and the source of the transistor 30 is coupled to the bit line 24 to form the bit line node 28. One plate 38 of the capacitor 32 is coupled to the drain of the transistor 30, and the other plate 42 of the capacitor 32 is coupled to $V_{cc}$, which is usually circuit ground.

Figure 4:
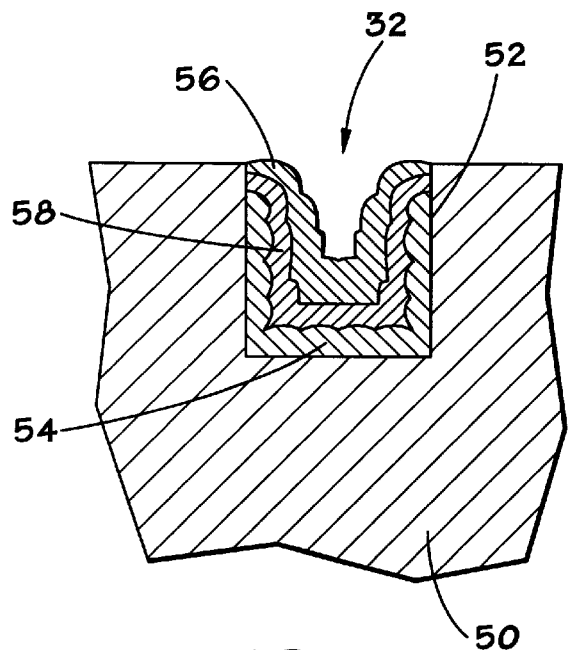
FIG. 4 illustrates a cross-sectional view of a container capacitor in accordance with the present invention.

The general operation of the memory device 10 as illustrated in FIGS. 1–3 is well known in the art, so such operation will not be described herein. However, the structure and fabrication of the storage capacitor 32 is unique. As illustrated in FIG. 4, a storage capacitor 32 is formed in a substrate 50. The substrate 50 is typically an exposed surface of an in-process wafer. In the disclosed embodiment, the substrate 50 surrounding the storage capacitor 32 may be comprised of a dielectric material, such as silicon oxide or boron phosphorous silicon glass (BPSG). It should also be understood that a suitable access device 30 may be placed laterally or vertically with respect to the storage capacitor 32 and that such connections are not illustrated here.

As illustrated in FIG. 4, the storage capacitor 32 is formed in a container 52. The storage capacitor 32 includes a first layer of conductive material 54 and a second layer of conductive material 56 which form the lower and upper plates of the capacitor 32. The first conductive layer 54 is separated from the second conductive layer 56 by a layer of dielectric material 58, which is disposed in between. As mentioned in reference to FIG. 3, one of the plates of the storage capacitor 32 will be coupled to $V_{cc}$ while the opposite plate will be coupled to the access device 30.

Figure 5:
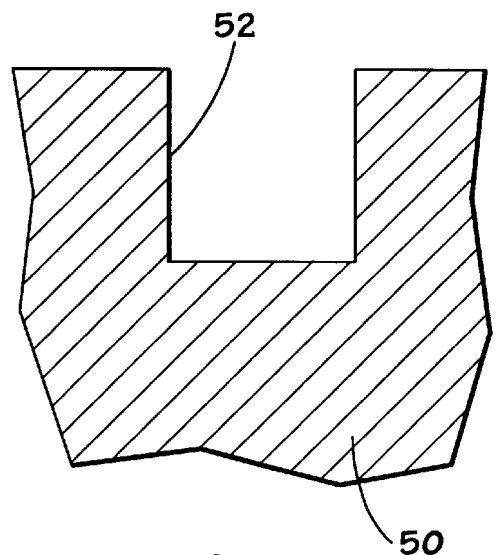
FIG. 5 illustrates a substrate having a container formed therein.
Figure 6:
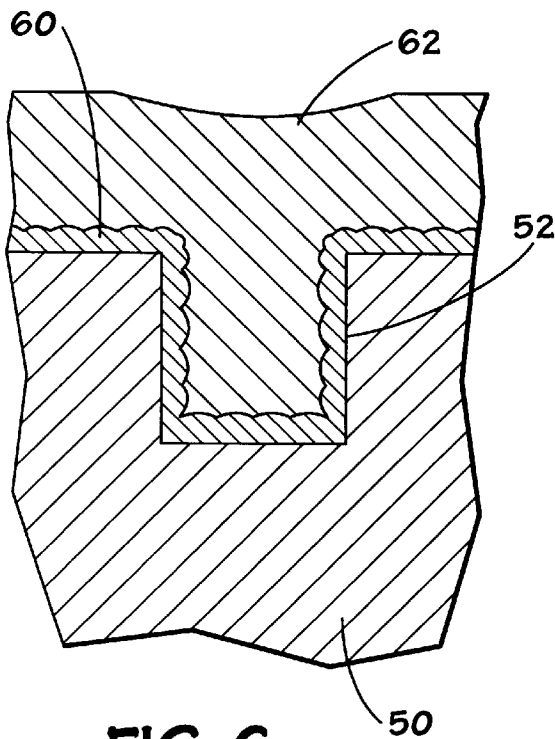
FIG. 6 illustrates a layer of polysilicon and photoresist formed over the substrate and container of FIG. 5.
Figure 7:
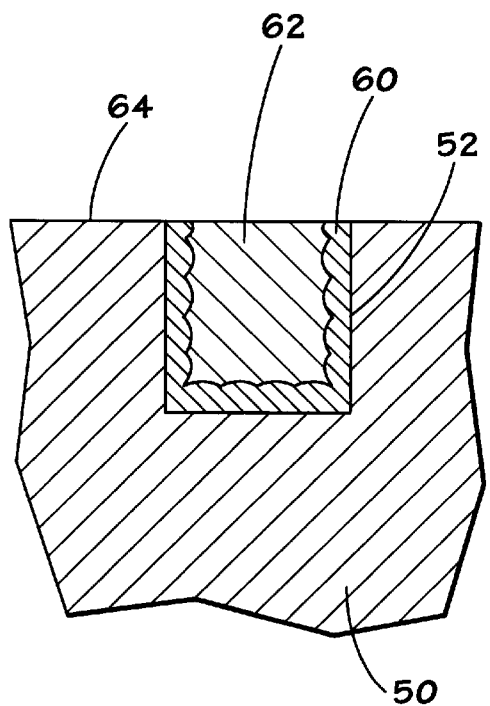
FIG. 7 illustrates the structure of FIG. 6 after a chemical-mechanical planarization process.

The fabrication of the storage capacitor 32, as illustrated in FIG. 4, will now be described in reference to FIGS. 5–9. As illustrated in FIG. 5, the container 52 is formed in the substrate 50. The container 52 may be formed by any suitable method, such as by using standard photolithographic and etching methods. Once the container 52 has been formed, a layer of conductive material 60, which will become the first layer of conductive material 54, is deposited on the substrate 50 and in the container 52, as illustrated in FIG. 6. The conductive material 60 may be any suitable conductive material, such as polysilicon or metal. Advantageously, the conductive layer 60 is a blanket polysilicon deposition that coats the sides and bottoms of the container 52 with polysilicon.

Once the conductive layer 60 has been deposited, a layer of photoresist 62 is deposited over the conductive layer 60. The layer of photoresist 62 may be spun onto the conductive layer 60 and then baked to remove the solvent. It should be noticed that due to differential volume shrinkage, the thickness of the photoresist layer 62 over the container 52 is typically less than the thickness of the photoresist layer 62 over areas that do not have containers. It should also be noted that the layer 62 need not be photosensitive. For instance, an organic compound with suitable properties could be used as well.

To remove the layer 62 and the conductive layer 60 of polysilicon from the top surface 64 of the substrate 50, while leaving the photoresist and polysilicon in the container 52, a chemical-mechanical planarization (CMP) process is performed. Advantageously, the top surface 64 of the substrate 50 acts as a CMP stop to determine when the top surface 64 of the substrate 50 is clear of the conductive material 60 and the photoresist 62. Instead of using the top surface 64 of the substrate 50 as a CMP stop, a timed CMP process may also be suitable. The CMP process produces the structure illustrated in FIG. 7.

A dry isotropic etchant, such as nitrogen trifluoride with oxygen, or a dry anisotropic etchant, such as chlorine with hydrogen bromide, is then used to remove any remaining polysilicon 60 from the top surface 64 of the substrate 50 and, also, to recess the polysilicon within the container 52. The amount that the polysilicon within the container 52 is recessed should be carefully controlled because capacitance will be lost as the plate 54 becomes smaller. Advantageously, the amount that the polysilicon within the container 52 is recessed may be controlled by the amount of time the etchant is used using known etch rates. The recessed polysilicon layer 54 within the container 52 reduces the chances of residual polysilicon remaining between containers, and, thus, reduces the chances of short circuits caused by such floaters.

Figure 8:
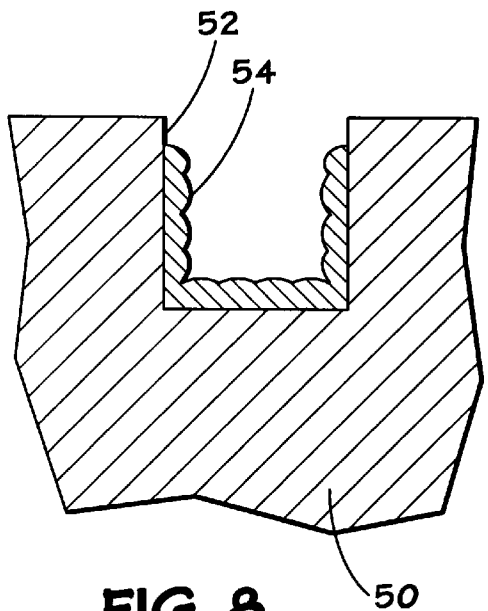
FIG. 8 illustrates the structure of FIG. 7 after an etching process.
Figure 9:
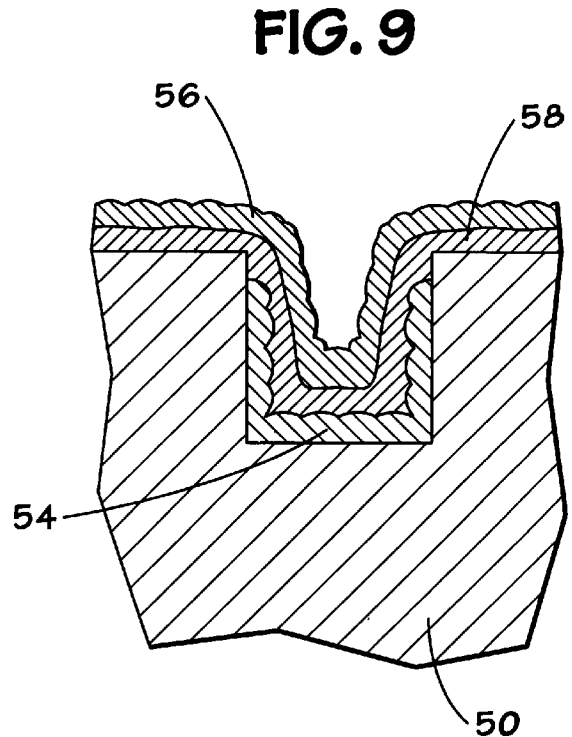
FIG. 9 illustrates the structure of FIG. 8 after fabrication of a layer of dielectric and a second layer of polysilicon.

Once the first conductive layer 54 of polysilicon has been recessed within the container 52, the remaining photoresist 62 is then removed from the container to produce the structure illustrated in FIG. 8. Subsequently, as illustrated in FIG. 9, the layer of dielectric 58 and the second conductive layer 56 is deposited over the substrate 50 and into the container 52 to cover the lower plate 54. If a common upper plate is desired, the container structure will resemble the device illustrated in FIG. 9. Alternatively, rather than having a common conductive layer 56, as illustrated in FIG. 9, portions of the dielectric layer 58 and the second conductive layer 56 may be removed by a suitable process, such as etching or chemical-mechanical planarization, to fabricate a storage capacitor 32 having a discreet upper plate 56, as illustrated in FIG. 4.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of forming a recessed microelectronic structure, the method comprising the steps of:
   (a) forming a container in a substrate, the substrate having an upper surface;
   (b) disposing a layer of conductive material within the container and over the upper surface of the substrate;
   (c) disposing a layer of dissimilar material over the layer of conductive material;
   (d) removing the layer of dissimilar material and the layer of conductive material from the upper surface of the substrate while leaving the layer of dissimilar material and the layer of conductive material within the container substantially even with the upper surface of the substrate; and
   (e) dry etching a portion of the layer of conductive material remaining in the container to recess the layer of conductive material below the upper surface of the container while leaving the layer of dissimilar material substantially even with the upper surface of the substrate.

2. The method, as set forth in claim 1, wherein the dissimilar material comprises photoresist.

3. The method, as set forth in claim 1, wherein the conductive material comprises polysilicon.

4. The method, as set forth in claim 1, wherein the substrate comprises a dielectric material.

5. The method, as set forth in claim 1, wherein step (d) comprises the step of:
   removing the layer of dissimilar material and the layer of conductive material from the upper surface of the substrate by chemical mechanical planarization.

6. A method of forming a recessed microelectronic structure, the method comprising the steps of:
   (a) forming a container in a substrate, the substrate having an upper surface;
   (b) disposing a layer of conductive material within the container and over the upper surface of the substrate;
   (c) disposing a layer of dissimilar material over the layer of conductive material;
   (d) removing the layer of dissimilar material and the layer of conductive material from the upper surface of the substrate by chemical mechanical planarization while leaving the layer of dissimilar material and the layer of conductive material within the container substantially even with the upper surface of the substrate; and
   (e) recessing a portion of the layer of conductive material remaining in the container below the upper surface of the container while leaving the layer of dissimilar material substantially even with the upper surface of the substrate.

7. The method, as set forth in claim 6, wherein the dissimilar material comprises photoresist.

8. The method, as set forth in claim 6, wherein the conductive material comprises polysilicon.

9. The method, as set forth in claim 6, wherein the substrate comprises a dielectric material.

10. The method, as set forth in claim 6, wherein step (e) comprises the step of:
    dry etching a portion of the layer of conductive material remaining in the container to recess the layer of conductive material below the upper surface of the container.

11. A method of forming a recessed microelectronic structure, the method comprising the steps of:
    (a) forming a container in a dielectric material, the dielectric material having an upper surface;
    (b) disposing a layer of conductive material within the container and over the upper surface of the dielectric material;
    (c) disposing a layer of photoresist over the layer of conductive material;
    (d) removing the layer of photoresist and the layer of conductive material from the upper surface of the dielectric material using chemical mechanical planarization while leaving the layer of photoresist and the layer of conductive material within the container substantially even with the upper surface of the substrate; and
    (e) dry etching a portion of the layer of conductive material remaining in the container to recess the layer of conductive material below the upper surface of the container while leaving the layer of photoresist substantially even with the upper surface of the substrate.

12. The method, as set forth in claim 11, wherein the conductive material comprises polysilicon.

13. A method of forming a recessed microelectronic structure, the method comprising the steps of:
    (a) forming a container in a dielectric material, the dielectric material having an upper surface;
    (b) disposing a layer of polysilicon within the container and over the upper surface of the dielectric material;
    (c) disposing a layer of photoresist over the layer of polysilicon;
    (d) removing the layer of photoresist and the layer of polysilicon from the upper surface of the dielectric material using chemical mechanical planarization while leaving the layer of photoresist and the layer of polysilicon within the container substantially even with the upper surface of the substrate; and
    (e) dry etching a portion of the layer of polysilicon remaining in the container to recess the layer of polysilicon below the upper surface of the container while leaving the layer of photoresist substantially even with the upper surface of the substrate.

14. A method of forming a capacitor in a microelectronic circuit, the method comprising the steps of:
    (a) forming a container in a substrate, the substrate having an upper surface;
    (b) disposing a first layer of conductive material within the container and over the upper surface of the substrate;
    (c) disposing a layer of photoresist over the first layer of conductive material;
    (d) removing the layer of photoresist and the first layer of conductive material from the upper surface of the substrate using chemical mechanical planarization;
    (e) recessing the first layer of conductive material remaining in the container below the upper surface of the container;
    (f) removing the layer of photoresist remaining in the container;
    (g) disposing a layer of dielectric material over the recessed first layer of conductive material and over the upper surface of the substrate;
    (h) disposing a second layer of conductive material over the layer of dielectric material; and
    (i) removing at least a portion of the layer of dielectric material and at least a portion of the second layer of conductive material from the upper surface of the substrate.

15. The method, as set forth in claim 14, wherein the conductive material comprises polysilicon.

16. The method, as set forth in claim 14, wherein the substrate comprises a dielectric material.

17. A method of forming a capacitor in a microelectronic circuit, the method comprising the steps of:

(a) forming a container in a substrate, the substrate having an upper surface;

(b) disposing a first layer of conductive material within the container and over the upper surface of the substrate;

(c) disposing a layer of photoresist over the first layer of conductive material;

(d) removing at least a portion of the layer of photoresist and at least a portion of the first layer of conductive material from the upper surface of the substrate to expose at least a portion of the upper surface of the substrate adjacent the container;

(e) dry etching a portion of the first layer of conductive material remaining in the container to recess the first layer of conductive material below the upper surface of the container;

(f) removing the layer of photoresist remaining in the container;

(g) disposing a layer of dielectric material over the recessed first layer of conductive material and over the upper surface of the substrate;

(h) disposing a second layer of conductive material over the layer of dielectric material; and (i) removing at least a portion of the layer of dielectric material and at least a portion of the second layer of conductive material from the upper surface of the substrate.

18. The method, as set forth in claim 17, wherein the conductive material comprises polysilicon.

19. The method, as set forth in claim 17, wherein the substrate comprises a dielectric material.

20. A method of forming a capacitor in a microelectronic circuit, the method comprising the steps of:

(a) forming a container in a first layer of dielectric material, the first layer of dielectric material having an upper surface;

(b) disposing a first layer of polysilicon within the container and over the upper surface of the first layer of dielectric material;

(c) disposing a layer of photoresist over the first layer of polysilicon;

(d) removing the layer of photoresist and the first layer of polysilicon from the upper surface of the first layer of dielectric material using chemical mechanical planarization;

(e) dry etching a portion of the first layer of polysilicon remaining in the container to recess the first layer of polysilicon below the upper surface of the first layer of dielectric material;

(f) removing the layer of photoresist remaining in the container;

(g) disposing a second layer of dielectric material over the recessed first layer of polysilicon and over the upper surface of the first layer of dielectric material; and (h) disposing a second layer of polysilicon over the second layer of dielectric material.

21. A method of forming a recessed microelectronic structure, the method comprising the steps of:

(a) forming a container in a substrate, the substrate having an upper surface;

(b) disposing a conformal layer of conductive material within the container and over the upper surface of the substrate;

(c) disposing a layer of dissimilar material over the layer of conductive material;

(d) removing the layer of dissimilar material and the layer of conductive material from the upper surface of the substrate; and (e) dry etching a portion of the layer of conductive material remaining in the container to recess the layer of conductive material slightly below the upper surface of the container.

22. The method, as set forth in claim 21, wherein the dissimilar material comprises photoresist.

23. The method, as set forth in claim 21, wherein the conductive material comprises polysilicon.

24. The method, as set forth in claim 21, wherein the substrate comprises a dielectric material.

25. The method, as set forth in claim 21, wherein step (d) comprises the step of:

removing the layer of dissimilar material and the layer of conductive material from the upper surface of the substrate by chemical mechanical planarization to leave the layer of dissimilar material and the layer of conductive material within the container substantially even with the upper surface of the substrate.

26. A method of forming a recessed microelectronic structure, the method comprising the steps of:

(a) forming a container in a substrate, the substrate having an upper surface;

(b) disposing a conformal layer of conductive material within the container and over the upper surface of the substrate;

(c) disposing a layer of dissimilar material over the layer of conductive material;

(d) removing the layer of dissimilar material and the layer of conductive material from the upper surface of the substrate while leaving the layer of dissimilar material and the layer of conductive material within the container substantially even with the upper surface of the substrate; and (e) dry etching a portion of the layer of conductive material remaining in the container to recess the layer of conductive material slightly below the upper surface of the container while leaving the layer of dissimilar material substantially even with the upper surface of the substrate.

27. The method, as set forth in claim 26, wherein the dissimilar material comprises photoresist.

28. The method, as set forth in claim 26, wherein the conductive material comprises polysilicon.

29. The method, as set forth in claim 26, wherein the substrate comprises a dielectric material.

30. The method, as set forth in claim 26, wherein step (d) comprises the step of:

removing the layer of dissimilar material and the layer of conductive material from the upper surface of the substrate by chemical mechanical planarization.

31. A method of forming a recessed microelectronic structure, the method comprising the steps of:

(a) forming a container in a substrate, the substrate having an upper surface;

(b) disposing a conformal layer of conductive material within the container and over the upper surface of the substrate;

(c) disposing a layer of dissimilar material over the layer of conductive material;

(d) removing the layer of dissimilar material and the layer of conductive material from the upper surface of the substrate by chemical mechanical planarization to leave the layer of dissimilar material and the layer of conductive material within the container substantially even with the upper surface of the substrate; and (e) recessing a portion of the layer of conductive material remaining in the container slightly below the upper surface of the container.

32. The method, as set forth in claim 31, wherein the dissimilar material comprises photoresist.

33. The method, as set forth in claim 31, wherein the conductive material comprises polysilicon.

34. The method, as set forth in claim 31, wherein the substrate comprises a dielectric material.

35. The method, as set forth in claim 31, wherein step (e) comprises the step of:

dry etching a portion of the layer of conductive material remaining in the container to recess the layer of conductive material slightly below the upper surface of the container while leaving the layer of dissimilar material substantially even with the upper surface of the substrate.

36. A method of forming a recessed microelectronic structure, the method comprising the steps of:

(a) forming a container in a substrate, the substrate having an upper surface;

(b) disposing a conformal layer of conductive material within the container and over the upper surface of the substrate;

(c) disposing a layer of dissimilar material over the layer of conductive material;

(d) removing the layer of dissimilar material and the layer of conductive material from the upper surface of the substrate by chemical mechanical planarization to leave the layer of dissimilar material and the layer of conductive material within the container substantially even with the upper surface of the substrate; and (e) recessing a portion of the layer of conductive material remaining in the container slightly below the upper surface of the container while leaving the layer of dissimilar material substantially even with the upper surface of the substrate.

37. The method, as set forth in claim 36, wherein the dissimilar material comprises photoresist.

38. The method, as set forth in claim 36, wherein the conductive material comprises polysilicon.

39. The method, as set forth in claim 36, wherein the substrate comprises a dielectric material.

40. The method, as set forth in claim 36, wherein step (e) comprises the step of:

dry etching a portion of the layer of conductive material remaining in the container to recess the layer of conductive material slightly below the upper surface of the container while leaving the layer of dissimilar material substantially even with the upper surface of the substrate.

\* \* \* \* \*